United States Patent
Sato et al.

(10) Patent No.: US 9,711,558 B2
(45) Date of Patent: Jul. 18, 2017

(54) IMAGING DEVICE WITH PHOTOELECTRIC CONVERTER

(71) Applicant: Panasonic Intellectual Property Management Co., Ltd., Osaka (JP)

(72) Inventors: Yoshihiro Sato, Osaka (JP); Yoshinori Takami, Toyama (JP); Kosaku Saeki, Osaka (JP); Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/846,947

(22) Filed: Sep. 7, 2015

(65) Prior Publication Data

US 2016/0079297 A1 Mar. 17, 2016

(30) Foreign Application Priority Data

Sep. 12, 2014 (JP) .................................. 2014-186492
Aug. 6, 2015 (JP) .................................. 2015-156129

(51) Int. Cl.
*H01L 27/00* (2006.01)
*H01L 31/062* (2012.01)
*H01L 27/146* (2006.01)

(52) U.S. Cl.
CPC .... *H01L 27/14643* (2013.01); *H01L 27/1461* (2013.01); *H01L 27/14603* (2013.01); *H01L 27/14612* (2013.01); *H01L 27/14638* (2013.01); *H01L 27/14665* (2013.01)

(58) Field of Classification Search
CPC ......... H01L 27/14643; H01L 27/14665; H01L 27/14638; H01L 27/1461; H01L 27/14603
See application file for complete search history.

(56) References Cited

U.S. PATENT DOCUMENTS

| | | | | |
|---|---|---|---|---|
| 6,670,990 B1* | 12/2003 | Kochi | ............... | H01L 27/14609 250/208.1 |
| 6,946,638 B2* | 9/2005 | Kuwazawa | ....... | H01L 27/14609 250/208.1 |
| 7,928,483 B2* | 4/2011 | Murakoshi | ........ | H01L 21/76229 257/291 |
| 2005/0156264 A1* | 7/2005 | Sakano | ............. | H01L 27/14609 257/432 |

* cited by examiner

*Primary Examiner* — Thomas L Dickey
*Assistant Examiner* — Damon Hillman
(74) *Attorney, Agent, or Firm* — McDermott Will & Emery LLP

(57) ABSTRACT

An imaging device including a unit pixel cell comprising: a semiconductor substrate including a first conductivity type region of a first conductivity type, a first and second impurity regions of a second conductivity type provided in the first conductivity type region; a photoelectric converter located above the semiconductor substrate; and a first transistor including a gate electrode and at least a part of the second impurity region as a source or a drain. The first impurity region is at least partially located in a surface of the semiconductor substrate and electrically connected to the photoelectric converter. The second impurity region is electrically connected to the photoelectric converter via the first impurity region and has an impurity concentration lower than that of the first impurity region. The second impurity region at least partially overlaps the gate electrode in a plan view.

20 Claims, 12 Drawing Sheets

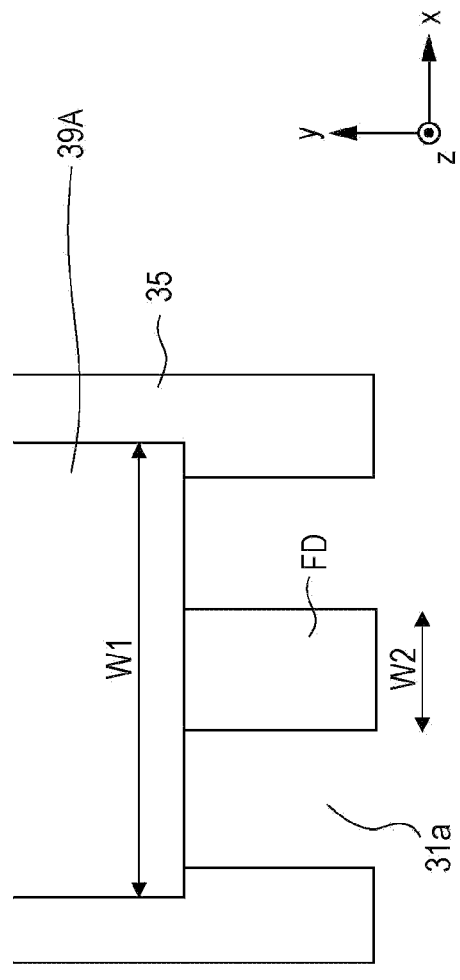
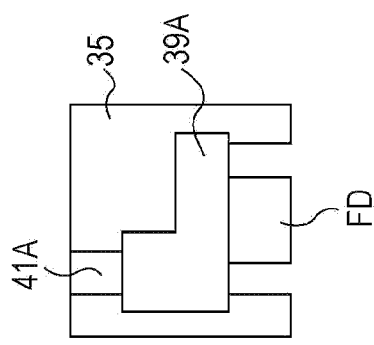
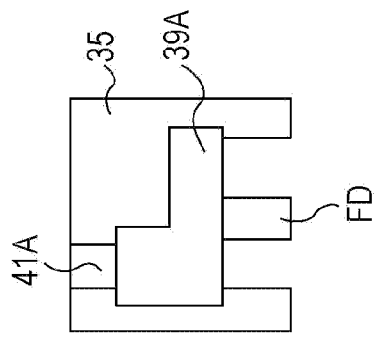
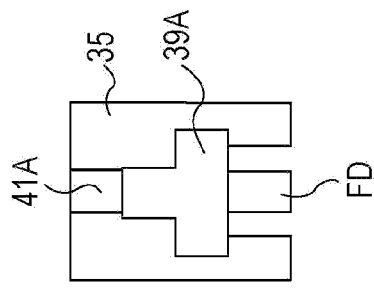
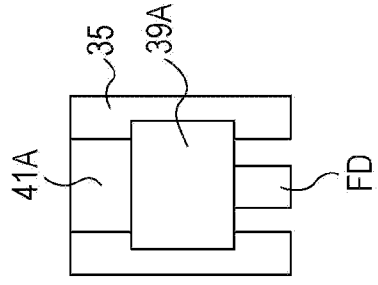

IMAGING DEVICE WITH PHOTOELECTRIC CONVERTER

BACKGROUND

1. Technical Field

The present disclosure relates to an imaging device including a photoelectric conversion film.

2. Description of the Related Art

A laminated imaging device has been proposed as an imaging device of a metal-oxide-semiconductor (MOS) type. In the laminated imaging device, a photoelectric conversion film is stacked on an uppermost surface of a semiconductor substrate. Charge generated in the photoelectric conversion film as a result of the photoelectric conversion is accumulated in a charge accumulation region. The charge accumulation region is also called floating diffusion (FD). In the laminated imaging device, the accumulated charge is read with a charge-coupled device (CCD) circuit or a complementary MOS (CMOS) circuit in the semiconductor substrate. A laminated imaging device is disclosed, for example, in Japanese Unexamined Patent Application Publication No. 2009-164604.

SUMMARY

It is desired to develop a technique for further reducing leak current (hereinafter also referred to as "dark current") in the laminated imaging device. One non-limiting and exemplary embodiment provides a laminated imaging device capable of suppressing an effect of dark current and capturing a high-resolution image.

In one general aspect, the techniques disclosed here feature an imaging device including unit pixel cells arranged one-dimensionally or two-dimensionally, each of the unit pixel cells comprising: a semiconductor substrate including a first conductivity type region of a first conductivity type, a first impurity region of a second conductivity type provided in the first conductivity type region, and a second impurity region of the second conductivity type provided in the first conductivity type region; a photoelectric converter located above the semiconductor substrate; and a first transistor including a first gate electrode and at least a part of the second impurity region as any one of a source and a drain of the first transistor, wherein the first impurity region is at least partially located in a surface of the semiconductor substrate, the first impurity region being electrically connected to the photoelectric converter, the second impurity region is electrically connected to the photoelectric converter via the first impurity region, the second impurity region having an impurity concentration lower than an impurity concentration of the first impurity region, and a first portion of the second impurity region overlaps a second portion of the first gate electrode in a plan view.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 12A is a schematic plan view of a unit pixel cell according to another exemplary embodiment around an FD region and a gate electrode;

FIG. 12B is a schematic plan view of an example of the layout of the gate electrode;

FIG. 12C is a schematic plan view of an example of the layout of the gate electrode;

FIG. 12D is a schematic plan view of an example of the layout of the gate electrode; and FIG. 12E is a schematic plan view of an example of the layout of the gate electrode.

DETAILED DESCRIPTION

Figure 1:
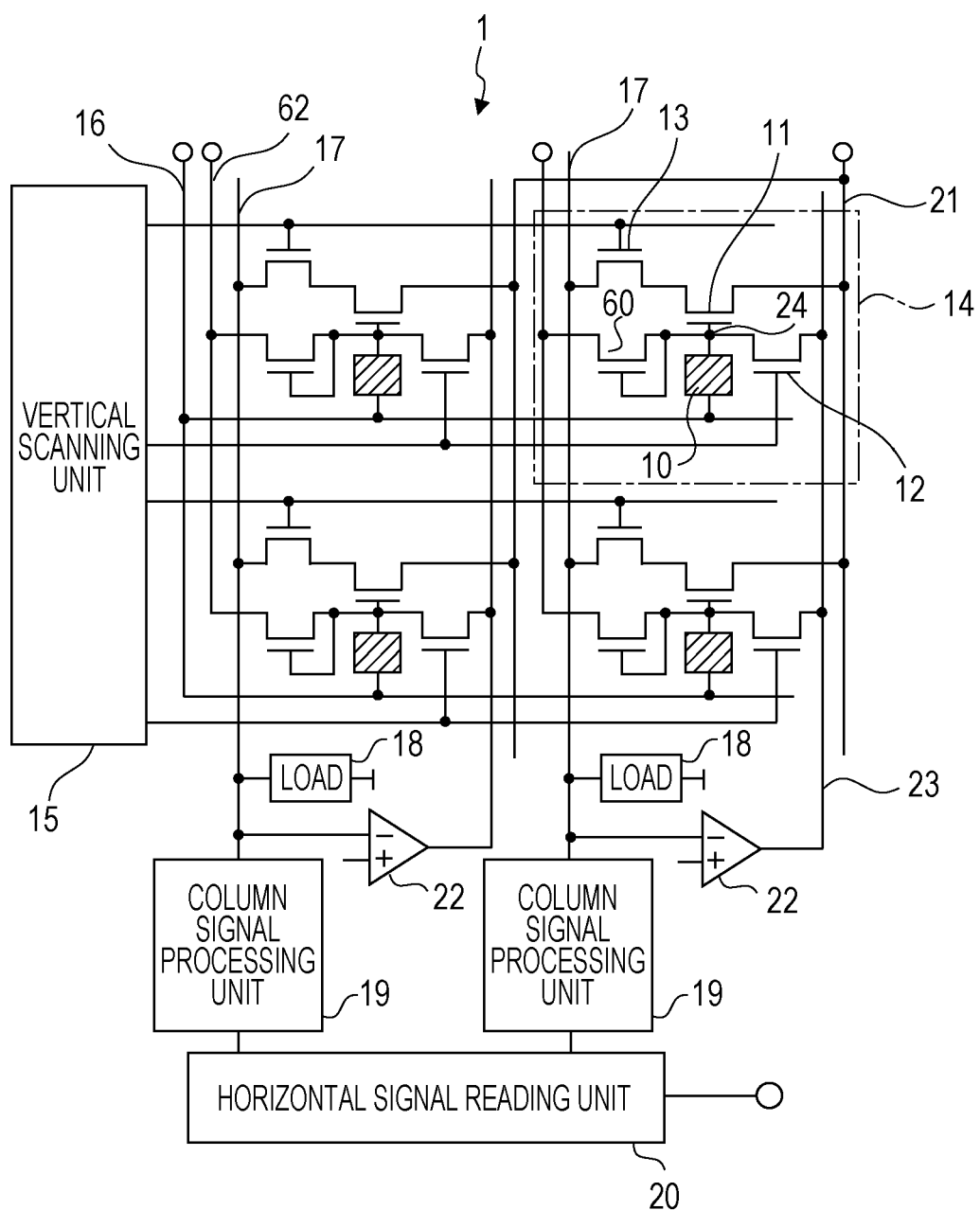
FIG. 1 is a schematic diagram illustrating the circuit configuration of an imaging device according to a first exemplary embodiment.

A laminated image sensor requires a contact for transmitting signal charge generated in a photoelectric conversion film as a result of photoelectric conversion to a driving circuit provided in a semiconductor substrate. Various pn junctions are formed around the contact in the semiconductor substrate. Leak current is generated in these pn junctions. Because it is difficult to distinguish signal charge generated as a result of photoelectric conversion from charge caused by leak current, the charge caused by leak current might act as noise. As a result, the performance of the image sensor deteriorates.

In view of this problem, the present inventor has devised an imaging device having a novel configuration.

Embodiments of the present disclosure will be described hereinafter with reference to the drawings. The present disclosure is not limited to the following embodiments. The present disclosure may be modified without deviating from the scope within which the advantageous effects of the present disclosure can be produced. An embodiment and another embodiment may be combined with each other. In the following description, the same components or components similar to each other are given the same reference numerals. Redundant description might be omitted.

First Embodiment

The configuration and functions of an imaging device 1 according to a first embodiment will be described with reference to FIGS. 1 to 4.

Configuration of Imaging Device 1

FIG. 1 schematically illustrates the circuit configuration of the imaging device 1 according to the first embodiment.

The imaging device 1 is a laminated imaging device. The imaging device 1 includes a plurality of unit pixel cells 14, a driving circuit, a photoelectric conversion film control line 16, a plurality of vertical signal lines 17, a plurality of power supply lines 21, and a plurality of feedback lines 23. The plurality of unit pixel cells 14 are arranged on a semiconductor substrate 31 in two dimensions, that is, in a row direction and a column direction, to form a photosensitive area (pixel area). The driving circuit sequentially drives the plurality of unit pixel cells 14 and reads signal charge generated as a result of photoelectric conversion. The imaging device 1 may be a line sensor, instead. In this case, the plurality of unit pixel cells 14 are arranged in one dimension.

The driving circuit typically includes a vertical scanning unit 15, a horizontal signal reading unit 20, a plurality of column signal processing units 19, a plurality of load units 18, and a plurality of differential amplifiers 22. The vertical scanning unit 15 is also referred to as a "row scanning circuit". The horizontal signal reading unit 20 is also referred to as a "column scanning circuit". The column signal processing units 19 are also referred to as "row signal accumulation units". The differential amplifiers 22 are also referred to as "feedback amplifiers".

Each unit pixel cell 14 includes a photoelectric conversion unit 10, an amplifying transistor 11, a reset transistor 12, and an address transistor (row selection transistor) 13. As illustrated in FIG. 1, each unit pixel cell 14 may further include a burn-in prevention transistor 60. The configuration of a unit pixel cell including the burn-in prevention transistor 60 will be described in a third embodiment.

The power supply lines (source follower power supply) 21 are used for supplying a certain power supply voltage to the unit pixel cells 14. The vertical scanning unit 15 is electrically connected to the unit pixel cell 14 in each row through a signal line corresponding to each row. The horizontal signal reading unit 20 is electrically connected to the column signal processing units 19. Each column signal processing unit 19 is connected to the unit pixel cells 14 arranged in a corresponding column through a corresponding vertical signal line 17. Each load unit 18 is electrically connected to a corresponding vertical signal line 17.

Each differential amplifier 22 is provided for a corresponding column. A negative input terminal of each differential amplifier 22 is connected to a corresponding vertical signal line 17. An output terminal of each differential amplifier 22 is connected to the unit pixel cells 14 in a corresponding column through a corresponding feedback line 23.

Each photoelectric conversion unit 10 is electrically connected to a drain of a corresponding reset transistor 12 and a gate of a corresponding amplifying transistor 11 and converts light (incident light) incident on a corresponding unit pixel cell 14 into charge. In other words, each photoelectric conversion unit 10 generates signal charge according to the amount of incident light.

Each amplifying transistor 11 outputs signal voltage according to the amount of signal charge generated by a corresponding photoelectric conversion unit 10. Each reset transistor 12 resets (initializes) the signal charge generated by a corresponding photoelectric conversion unit 10. In other words, each reset transistor 12 resets the potential of a gate of a corresponding amplifying transistor 11. More specifically, reset voltage is applied to the gate of each amplifying transistor 11 through a corresponding reset transistor 12. Each address transistor 13 selectively outputs signal voltage to a corresponding vertical signal line 17 from a corresponding unit pixel cell 14. The output voltage of each amplifying transistor 11 is thus read by a corresponding vertical signal line 17 through a corresponding address transistor 13.

The vertical scanning unit 15 applies row selection signals for turning on or off address transistors 13 to the gates of the address transistors 13 row by row. As a result, rows to be read are sequentially scanned in a vertical direction (column direction) and selected. Signal voltage is read from the unit pixel cells 14 in a selected row to the vertical signal lines 17. The vertical scanning unit 15 also applies reset signals for turning on or off reset transistors 12 to gates of the reset transistors 12 row by row. As a result, the unit pixel cells 14 in rows to be subjected to a reset operation are sequentially selected.

The photoelectric conversion film control line 16 is connected to all the unit pixel cells 14. A positive constant voltage is applied to all the photoelectric conversion units 10 in the imaging device 1 through the photoelectric conversion film control line 16.

Each vertical signal line 17 is provided for the unit pixel cells 14 in a corresponding column. Each vertical signal line 17 is connected to sources of the address transistors 13 of the unit pixel cells 14 in the corresponding column. Signal voltage read from the unit pixel cells 14 is transmitted through the vertical signal lines 17 in the column direction (vertical direction).

Each load unit 18 is connected to a corresponding vertical signal line 17. The load units 18 and the amplifying transistors 11 configure source follower circuits.

The column signal processing units 19 perform a noise suppression signal process typified by correlated double sampling and analog-to-digital (A/D) conversion. Each column signal processing unit 19 is connected to the vertical signal line 17 in a corresponding column. The column signal processing units 19 are thus arranged in a horizontal direction (column direction).

The horizontal signal reading unit 20 sequentially reads signals from the column signal processing units 19 and outputs the signals to a horizontal common signal line (not illustrated).

The power supply lines 21 are connected to drains of the amplifying transistors 11. The power supply lines 21 are connected to the unit pixel cells 14 in the photosensitive area in the vertical direction (vertical direction in FIG. 1). This is because, since the unit pixel cells 14 are addressed row by row, a pixel drive current for each row flows through a single power supply line 21 and a large voltage drop is caused if the power supply lines 21 are connected to the unit pixel cells 14 in the row direction. A common source follower power supply voltage is applied to the amplifying transistors 11 of all the unit pixel cells 14 through the power supply lines 21.

Each differential amplifier 22 is connected to the unit pixel cells 14 in a corresponding column. The output terminal of each differential amplifier 22 is connected to the drains of corresponding reset transistors 12 through a corresponding feedback line 23. Each differential amplifier 22 receives output values of corresponding address transistors 13 when the address transistors 13 and the reset transistors 12 are in conductive states. Each differential amplifier 22 performs a feedback operation so that gate potentials of corresponding amplifying transistors 11 become a certain feedback voltage. An output voltage value of each differential amplifier 22 at this time is a positive voltage of 0 V or about 0 V. The feedback voltage refers to the output voltage of each differential amplifier 22.

In the imaging device 1, the unit pixel cells 14 in a row selected by the vertical scanning unit 15 are selected. Signal charges generated as a result of photoelectric conversion performed by the photoelectric conversion units 10 of the selected unit pixel cells 14 is amplified by corresponding amplifying transistors 11. The amplified signal charges are output to the vertical signal lines 17 through corresponding address transistors 13.

The output signal charges are accumulated in the column signal processing units 19 as electrical signals. The accumulated signal charges are selected by the horizontal signal reading unit 20 and output. Signal charges in the unit pixel cells 14 are discharged by turning on the reset transistors 12. During this process, the reset transistors 12 generate large thermal noise called "kTC noise". This thermal noise remains even after the reset transistors 12 are turned off and accumulation of signal charges begins.

In order to suppress thermal noise, the vertical signal lines 17 are connected to the negative input terminals of the differential amplifiers 22. Voltage values of the vertical signal lines 17, that is, voltage values input to the negative input terminals of the vertical signal lines 17, are subjected to reverse amplification in the differential amplifiers 22. The signals subjected to the reverse amplification are fed back to the drains of the reset transistors 12 through the feedback lines 23. The thermal noise generated by the reset transistors 12 can thus be suppressed through negative feedback control. An alternating current component of the thermal noise is also fed back to the drains of the reset transistors 12. As described above, a direct current component is a positive voltage of about 0 V.

Configuration of Unit Pixel Cell 14

Figure 2:
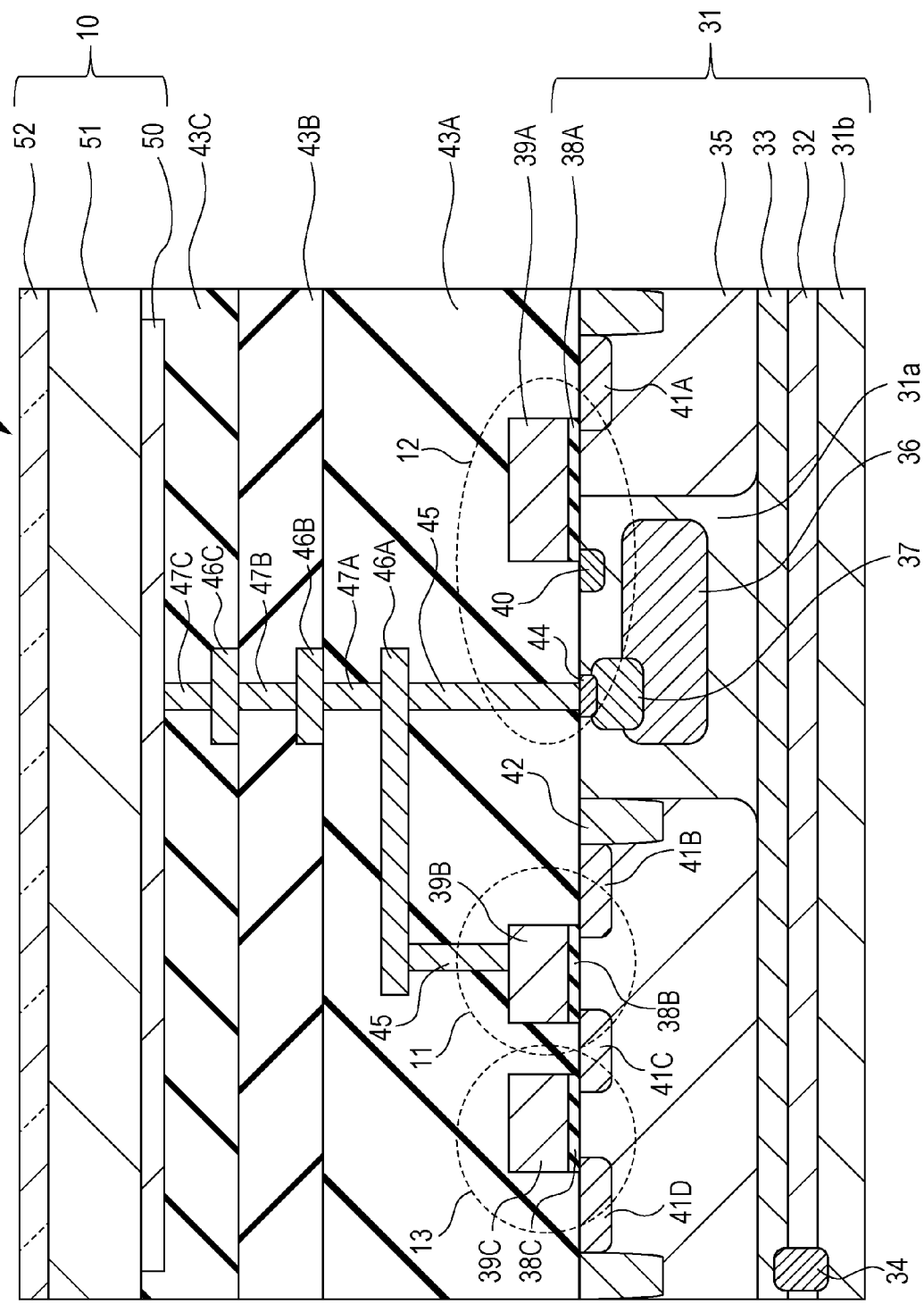
FIG. 2 is a schematic cross-sectional view of a unit pixel cell in the imaging device according to the first exemplary embodiment.

FIG. 2 schematically illustrates a cross section of one of the unit pixel cells 14 in the imaging device 1 according to the present embodiment. FIG. 2, however, does not illustrate an actual configuration. FIG. 2 illustrates three transistors in one cross-section in order to simplify description.

The unit pixel cell 14 includes the semiconductor substrate 31, a pixel circuit, a device separation region 42, interlayer insulating films 43A, 43B, and 43C, and a photoelectric conversion unit 10.

The semiconductor substrate 31 includes a p-type region in a surface thereof. The semiconductor substrate 31 is, for example, a substrate composed of p-type silicon (Si). Alternatively, the semiconductor substrate 31 may be an n-type silicon substrate with a p-type well region formed in a surface thereof. The pixel circuit includes an address transistor 13, an amplifying transistor 11, and a reset transistor 12 formed on the semiconductor substrate 31. The interlayer insulating films 43A, 43B, and 43C are stacked on the semiconductor substrate 31 in this order. The photoelectric conversion units 10 includes a pixel electrode 50 formed in an upper surface of the interlayer insulating film 43C, a photoelectric conversion film 51 formed on the pixel electrode 50, and a transparent electrode 52 formed on the photoelectric conversion film 51. An example of a configuration in which a p-type silicon substrate is used as the semiconductor substrate 31 will be described hereinafter.

First, a relationship between impurity concentrations of p-type impurity regions in the semiconductor substrate 31 of the unit pixel cell 14 will be described. The impurity concentration of a $p^-$-type impurity region 31a is the lowest in the semiconductor substrate 31. The impurity concentrations of p-type impurity regions 33 and 35 are higher than that of the $p^-$-type impurity region 31a. The impurity concentrations of the p-type impurity regions 33 and 35 are substantially the same. The impurity concentration of a p-type impurity region 34 is higher than those of the p-type impurity regions 33 and 35. The impurity concentration of the p-type impurity region 34 is higher than that of a p-type impurity region 40. The impurity concentration of the p-type impurity region 34 is the highest among the above-mentioned p-type impurity regions.

The semiconductor substrate 31 is composed of p-type silicon. The p-type impurity region 35 forms the surface of the semiconductor substrate 31 except for where the $p^-$-type impurity region 31a, which is located on a drain side of the reset transistor 12, is formed. The p-type impurity region 35 functions as a p-well layer.

The p-type impurity region 33 is formed under the p-type impurity region 35 across the semiconductor substrate 31 in such a way as to come into contact with the p-type impurity region 35. An n-type impurity region 32 is formed under the p-type impurity region 33 across the semiconductor substrate 31.

The p-type impurity region 34 is formed in part of the n-type impurity region 32. The p-type impurity region 34 electrically connects a lowest layer region 31b of the semiconductor substrate 31 and the p-type impurity region 33 to each other.

The n-type impurity region 32 prevents minority carriers from flowing into an FD region 24 (illustrated in FIG. 1), in which signal charge is accumulated, from the lowest layer region 31b of the semiconductor substrate 31. The potential of the n-type impurity region 32 is controlled through a well contact (not illustrated) formed in the periphery of the pixel.

The potential of the lowest layer region 31b of the semiconductor substrate 31 and the p-type impurity region 33 is controlled through a substrate contact (not illustrated) formed in the periphery of the pixel.

As described above, the p-type impurity region 35 is in contact with the p-type impurity region 33. The potential of the p-type impurity region 35 can therefore be controlled through the p-type impurity region 33. Because of such a well structure, a pixel well need not be formed around the FD region 24, and impurity concentration around the FD region can be reduced. An electric field of a pn junction around the FD region 24 can therefore be reduced, thereby suppressing an increase in leak current caused by the strength of the electric field of the pn junction.

The reset transistor 12 includes a gate insulating film 38A, a gate electrode 39A, a source region, and a drain region. In the $p^-$-type impurity region 31a, n-type impurity regions 36, 37, and 44 are formed and function as the drain region of the reset transistor 12. The second n-type impurity region 36 need not overlap the p-type impurity region 35 when viewed in a direction perpendicular to the surface of the semiconductor substrate 31. An n-type impurity region 41A is formed in the p-type impurity region 35. The n-type impurity region 41A functions as the source region of the reset transistor 12. The impurity concentration of the n-type impurity region 41A is higher than that of the n-type impurity region 36. More specifically, the impurity concentration of the n-type impurity region 41A is, for example, $1 \times 10^{18}/cm^3$ to $1 \times 10^{20}/cm^3$. The impurity concentration of the n-type impurity region 36 is, for example, $1 \times 10^{16}/cm^3$ to $5 \times 10^{17}/cm^3$.

A pn junction is formed between the n-type impurity regions 36, 37, and 44 connected to the pixel electrode 50 and the p⁻-type impurity region 31a. The pn junction forms a parasitic diode (also referred to an accumulation diode) in which signal charge is accumulated. The capacitance of the accumulation diode and wires leading to the pixel electrode 50 is generally called an "FD region".

Contact plugs 45 are provided in the unit pixel cell 14. The contact plugs 45 electrically connect the photoelectric conversion units 10 and the charge accumulation region (FD region 24) to each other. The contact plugs 45 also accumulate part of the signal charge generated in the photoelectric conversion unit 10.

As with the reset transistor 12, the amplifying transistor 11 includes a gate insulating film 38B, a gate electrode 39B, a source region, and a drain region. The address transistor 13 includes a gate insulating film 38C, a gate electrode 39C, a source region, and a drain region. In the p-type impurity region 35, on which the amplifying transistor 11 and the address transistor 13 are formed, n-type impurity regions 41B, 41C, and 41D are formed. The n-type impurity region 41B functions as the drain region of the amplifying transistor 11. The n-type impurity region 41C functions as the source region of the amplifying transistor 11 and the drain region of the address transistor 13. The n-type impurity region 41D functions as the source region of the address transistor 13. In the imaging device 1 according to the present embodiment, positive holes are used as signal charge. In the case of a sensor that uses electrons as signal charge, positions of the source regions and drain regions are switched.

The device separation region 42 insulates and separates a combination of the amplifying transistor 11 and the address transistor 13 and the reset transistor 12 from each other. The device separation region 42 is a p-type impurity region. The device separation region 42 is formed, for example, in the surface of the semiconductor substrate 31 between the amplifying transistor 11 and the reset transistor 12. Alternatively, the device separation region 42 may be formed in the surface of the semiconductor substrate 31 around the unit pixel cell 14. The device separation region 42 need not overlap the second n-type impurity region 36 when viewed in the direction perpendicular to the surface of the semiconductor substrate 31.

The n-type impurity region 44 is formed in the surface of the semiconductor substrate 31 under one of the contact plugs 45. The n-type impurity region 44 includes a highly concentrated n-type impurity and prevents expansion of a depletion layer (also referred to depletion) formed around a contact surface between the contact plug 45 and the semiconductor substrate 31. Since the expansion of the depletion layer can be suppressed, leak current caused by a lattice defect on an interface between the contact plug 45 and the semiconductor substrate 31 can be suppressed. Contact resistance can also be reduced.

When viewed in the direction perpendicular to the surface of the semiconductor substrate 31, the p-type impurity region 40 is formed in the surface of the semiconductor substrate 31 partially below the gate of the reset transistor 12 in the p⁻-type impurity region 31a, which is located on the drain side of the reset transistors 12. The p-type impurity region 40, however, need not necessarily be formed depending on design specification.

The p-type impurity region 40 suppresses leak current caused by a lattice defect on the surface of the semiconductor substrate 31. If a gate-off bias is applied to the reset transistor 12 while accumulating signal charge, a difference between surface potentials of the p-type impurity region 40 and the semiconductor substrate 31 can be decreased. It is also possible to suppress generation of a strong electric field in the surface of the semiconductor substrate 31 around an end portion of the gate electrode 39A on a side of the n-type impurity region 36. Leak current from the FD region 24 can therefore be suppressed.

The n-type impurity region 36 is formed at a position lower than the p-type impurity region 40 and the n-type impurity region 44 in a depth direction of the semiconductor substrate 31 (also referred to a direction perpendicular to the surface of the semiconductor substrate 31). The n-type impurity region 36 is formed in such a way as not to come into contact with the p-type impurity region 35 in a direction (also referred to horizontal direction) perpendicular to the depth direction of the semiconductor substrate 31. The ion implantation depth (also referred to range Rp) of the n-type impurity region 36 and the ion implantation depth of the p-type impurity region 40 are different from each other. An electric field of a pn junction between the n-type impurity region 36 and the p-type impurity region 40 can therefore be reduced, thereby suppressing leak current.

The n-type impurity region 44 is formed in the surface of the semiconductor substrate 31. The n-type impurity region 36 is formed at a position deeper than the p-type impurity region 40 and the n-type impurity region 44. Since the n-type impurity region 44 and the n-type impurity region 36 are separated from each other, the n-type impurity concentration of a region located between the n-type impurity region 44 and the n-type impurity region 36 decreases. This is why the n-type impurity region 37 is formed. In doing so, the n-type impurity region 44 and the n-type impurity region 36 are electrically connected to each other to suppress a decrease in the n-type impurity concentration of the region between the n-type impurity region 44 and the n-type impurity region 36. The n-type impurity region 37 also enables the n-type impurity region 36 to be formed at a deeper position from the surface of the semiconductor substrate 31.

The n-type impurity region 44 and the p-type impurity region 40, which is located below the gate electrode 39A, are separated from each other. An electric field of a pn junction between the n-type impurity region 44 and the p-type impurity region 40 can therefore be reduced, thereby suppressing leak current.

Figure 3A:
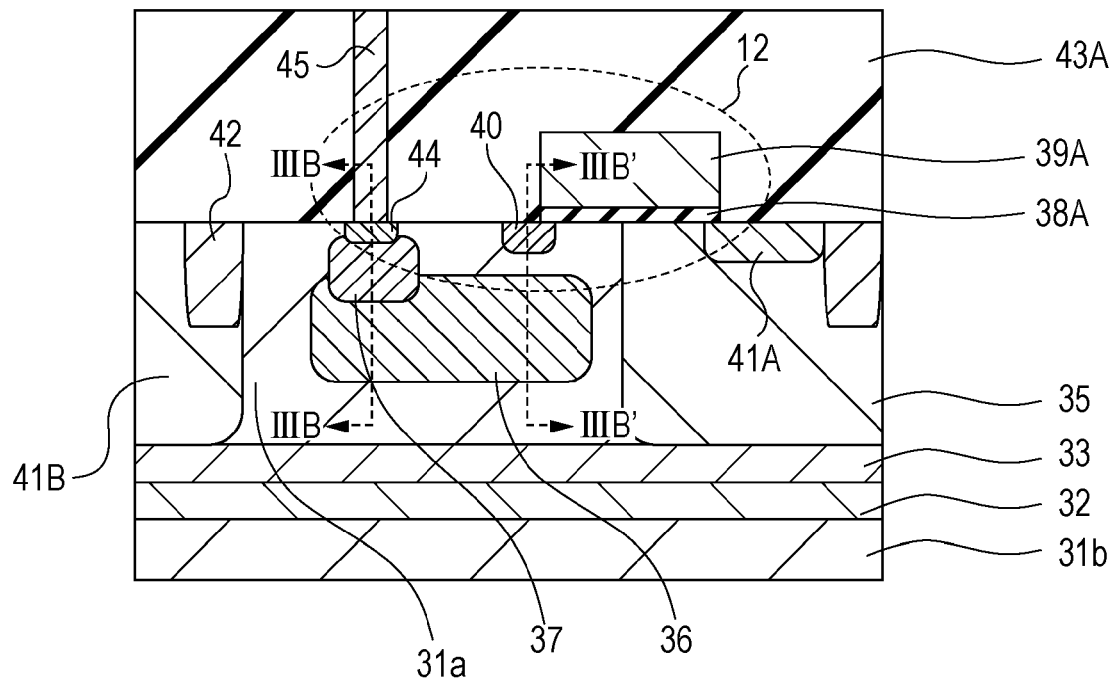
FIG. 3A is a schematic cross-sectional view of a portion of the unit pixel cell around a reset transistor.
Figure 3B:
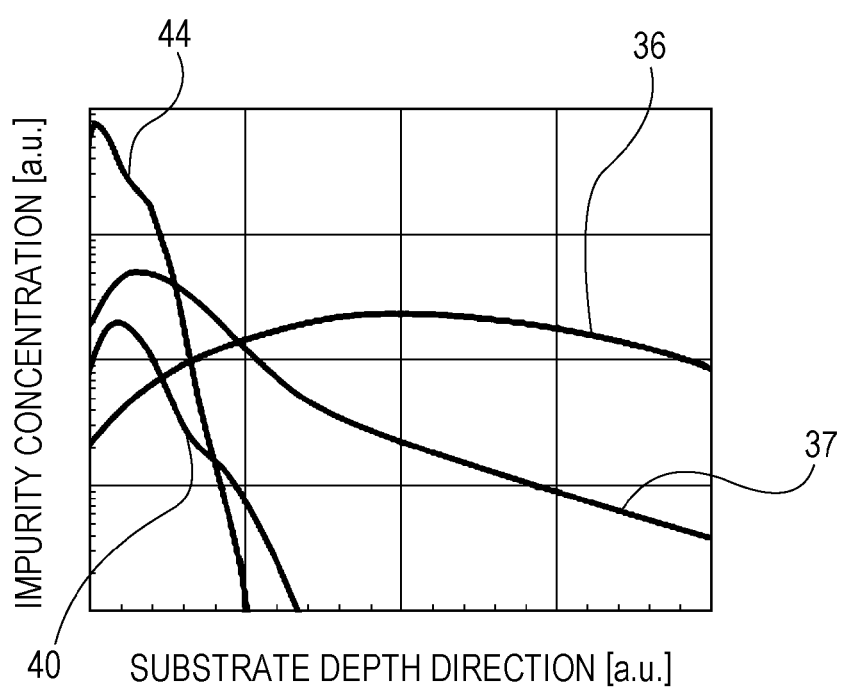
FIG. 3B is a chart showing a profile of an example of impurity concentrations in a depth direction in portions of a semiconductor substrate along line IIIB-IIIB and line IIIB'-IIIB' illustrated in FIG. 3A.

FIG. 3A illustrates a cross section of a portion of the imaging device 1 around the reset transistors 12. FIG. 3B is a profile of an example of impurity concentrations in the depth direction in portions of the drain region along line IIIB-IIIB and line IIIB'-IIIB' illustrated in FIG. 3A.

In FIG. 3B, a horizontal axis represents distance in the depth direction of the semiconductor substrate 31, and a vertical axis represents impurity concentration. The range Rp refers to a depth at which a peak value of impurity concentration is obtained. The ranges Rp of the n-type impurity region 44, the n-type impurity region 37, and the n-type impurity region 36 are observed in this order along Line IIIB-IIIB from the surface of the semiconductor substrate 31. A position at which a peak value of the impurity concentration of the n-type impurity region 36 is obtained is deeper than positions at which a peak values of the impurity concentrations of the n-type impurity region 37 and the n-type impurity region 44 are obtained.

The ranges Rp of the p-type impurity region 40 and the n-type impurity region 36 are observed in this order along Line IIIB'-IIIB' from the surface of the semiconductor substrate 31. A position at which a peak value of the impurity concentration of the n-type impurity region 36 is obtained is deeper than a position at which a peak value of the impurity concentration of the p-type impurity region 40 is obtained. The positions at which the peak values of the impurity concentrations of the p-type impurity region 40 and the n-type impurity region 36 are obtained, that is, the ranges Rp, are thus separated from each other. As a result, an impurity concentration (hereinafter referred to as an "intersecting concentration") at a position (depth) at which waveforms of the impurity concentrations of the p-type impurity region 40 and the n-type impurity region 36 intersect can be reduced. Leak current can therefore be suppressed.

In the impurity concentration profile, the peak value of the impurity concentration of the n-type impurity region 44 is larger than those of the impurity concentrations of the n-type impurity region 36 and the n-type impurity region 37. The peak value of the impurity concentration of the n-type impurity region 44 is, for example, $6 \times 10^{18}/cm^3$. The peak value of the impurity concentration of the p-type impurity region 40 is $2 \times 10^{17}/cm^3$. The peak value of the impurity concentration of the n-type impurity region 36 is $3 \times 10^{17}/cm^3$. The peak value of the impurity concentration of the n-type impurity region 37 is $5 \times 10^{17}/cm^3$. The intersecting concentration between the p-type impurity region 40 and the n-type impurity region 36 is desirably $1.0 \times 10^{17}/cm^3$ or less.

FIG. 3A conceptually illustrates, as the n-type impurity region 36, a rectangular region in which a certain impurity concentration can be obtained relative to the depth at which the peak value of impurity concentration is obtained. In fact, however, the n-type impurity region 36 is also formed in the surface of the semiconductor substrate 31, even though, as illustrated in FIG. 3B, the impurity concentration of the n-type impurity region 36 in the surface of the semiconductor substrate 31 is lower than that of the n-type impurity region 36 at the center of the semiconductor substrate 31. In the present embodiment, two pn junctions are formed on the surface of the semiconductor substrate 31 under the gate electrode 39A of the reset transistor 12 on the drain side of the reset transistor 12. In a region under the gate electrode 39A on the drain side of the reset transistor 12, a conductivity type is pnp in order of the p-type impurity region 40, the n-type impurity region 36, and the p⁻-type impurity region 31a in the profile of impurity concentrations in the horizontal direction. That is, the gate insulating film 38A and the pn junctions are in contact with each other. Leak current can therefore be suppressed.

The n-type impurity region 36 need not be formed in the surface of the semiconductor substrate 31. That is, as illustrated in FIG. 3A, the n-type impurity region 36 and the gate electrode 39A may be separated from each other in the depth direction with the gate insulating film 38A and the p⁻-type impurity region 31a provided therebetween. In doing so, it becomes possible to prevent exposure of a pn junction (depletion region) formed between the n-type impurity region 36 and the p-type impurity region 40 to the surface of the semiconductor substrate 31, thereby suppressing an increase in leak current caused by interface level.

In FIG. 2, the amplifying transistor 11 includes the gate electrode 39B connected to the pixel electrode 50 through one of the contact plugs 45. The amplifying transistor 11 outputs a signal voltage according to the potential of the pixel electrode 50.

The reset transistor 12 is connected to the pixel electrode 50 through one of the contact plugs 45. The reset transistor 12 resets the potential of the gate electrode 39B of the amplifying transistor 11 to reset voltage, that is, feedback voltage.

The address transistor 13 is provided between the amplifying transistor 11 and a corresponding vertical signal line 17 (not illustrated). The address transistor 13 outputs signal voltage to the vertical signal line 17 from the unit pixel cell 14. In the present embodiment, the address transistor 13 is inserted between the source region of the amplifying transistor 11 and the vertical signal line 17. The present disclosure, however, is not limited to this. The address transistor 13 may be inserted between the drain region of the amplifying transistor 11 and a corresponding power supply line 21, instead.

The gate electrode 39B of the amplifying transistor 11 and the pixel electrode 50 are connected to each other through one of the contact plugs 45, a wire 46A, a contact plug 47A, a wire 46B, a contact plug 47B, a wire 46C, and a contact plug 47C. Similarly, the drain region (the n-type impurity regions 44, 37, and 36) of the reset transistor 12 and the pixel electrode 50 are connected to each other through one of the contact plugs 45, the wire 46A, the contact plug 47A, the wire 46B, the contact plug 47B, the wire 46C, and the contact plug 47C.

In FIG. 2, contact plugs connected to the n-type impurity region 41D on the source side of the address transistor 13 and the n-type impurity region 41A on the source side of the reset transistor 12 are omitted. In practice, the n-type impurity region 41D is connected to the vertical signal line 17 through the contact plugs and wires. The n-type impurity region 41A is connected to a corresponding feedback line 23 through the contact plugs and wires.

The photoelectric conversion film 51 may be composed of, for example, an organic material or amorphous silicon. The photoelectric conversion film 51 is stacked above the semiconductor substrate 31. The photoelectric conversion film 51 converts incident light from outside into signal charge. The pixel electrode 50 is in contact with the photoelectric conversion film 51 under a surface of the photoelectric conversion film 51 on a side of the semiconductor substrate 31. The pixel electrode 50 collects the signal charge generated in the photoelectric conversion film 51. The transparent electrode 52 is in contact with on a surface of the photoelectric conversion film 51 on a side opposite to the pixel electrode 50. A positive constant voltage is applied to the transparent electrode 52 through the photoelectric conversion film control line 16. The signal charge generated by the photoelectric conversion film 51 can therefore be read to the pixel electrode 50.

Figure 4:
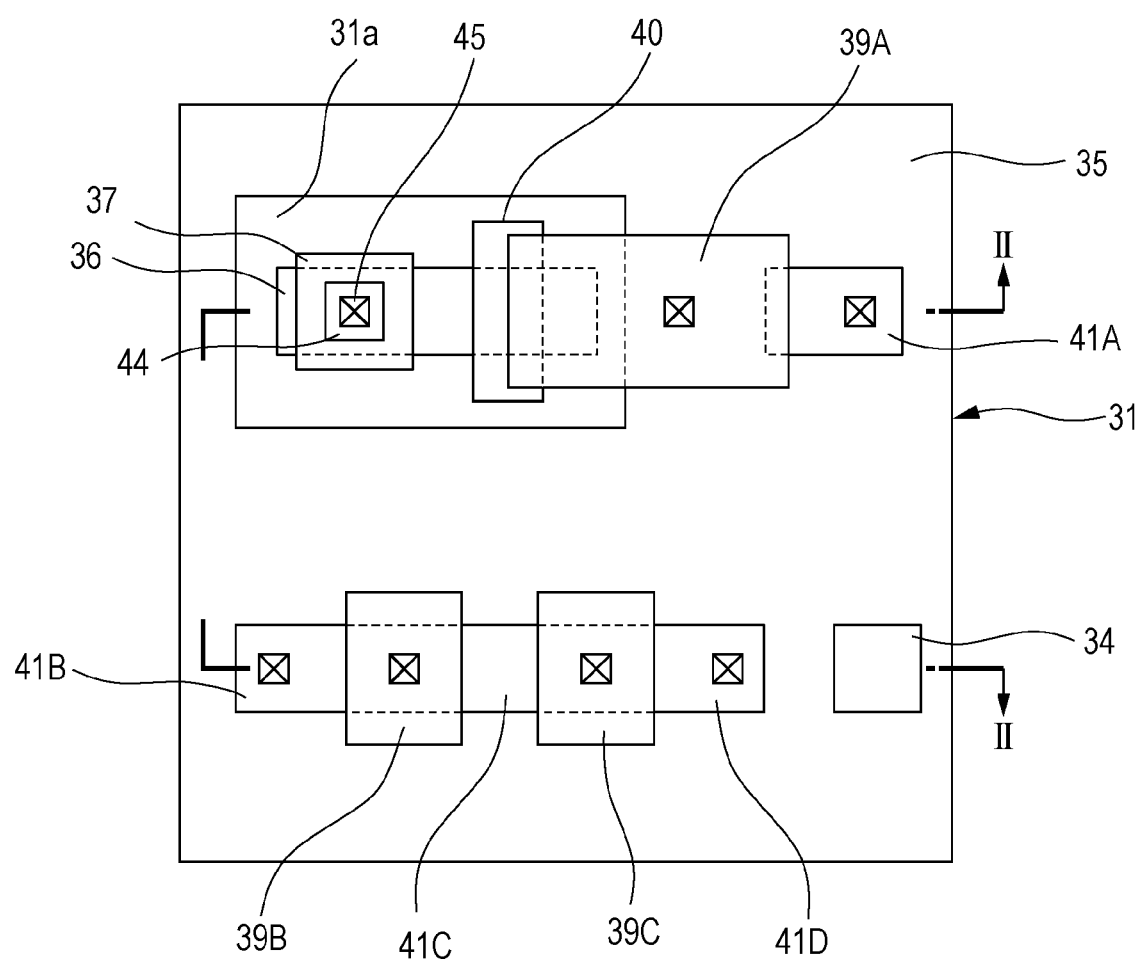
FIG. 4 is a plan view of the unit pixel cell illustrated in FIG. 2.

FIG. 4 is a plan view of the unit pixel cell 14 illustrated in FIG. 2. FIG. 2 schematically illustrates a cross section of the unit pixel cell 14 taken along line II-II illustrated in FIG. 4.

By separating ends of the n-type impurity region 36 from the p-type impurity region 35 in the horizontal direction, an electric field of a pn junction between the n-type impurity region 36 and the p-type impurity region 35 can be reduced, thereby suppressing leak current.

As described above, in order to suppress generation of a strong electric field, the p-type impurity region 40 is formed in such a way as to overlap, when viewed in the direction perpendicular to the surface of the semiconductor substrate 31, a region in which the n-type impurity region 36 and the gate electrode 39A overlap. On the other hand, the driving force of the reset transistor 12 might decrease due to the p-type impurity region 40 arranged between the gate electrode 39A and the n-type impurity region 36. In order to secure the driving force of the reset transistor 12, the n-type impurity region 36 is formed in such a way as to overlap, when viewed in the direction perpendicular to the surface of the semiconductor substrate 31, the gate electrode 39A without overlapping the p-type impurity region 40 in a certain region. Because of this configuration, the electric field of the pn junction around the FD region 24 can be reduced. Because an on current (reset operation) of the reset transistor 12 can be secured, it is possible to prevent a decrease in saturation signal level, which would otherwise be caused by a reset failure. The on current of the reset transistor 12 can thus be secured while suppressing leak current.

Method for Fabricating Imaging Device 1

An example of a method for fabricating the imaging device 1 will be described with reference to FIGS. 5A, 5B, 6A, and 6B. The imaging device 1 may be fabricated using one of various methods currently used for fabricating laminated imaging devices. In the following description, detailed description of the known methods is omitted.

Figure 5A:
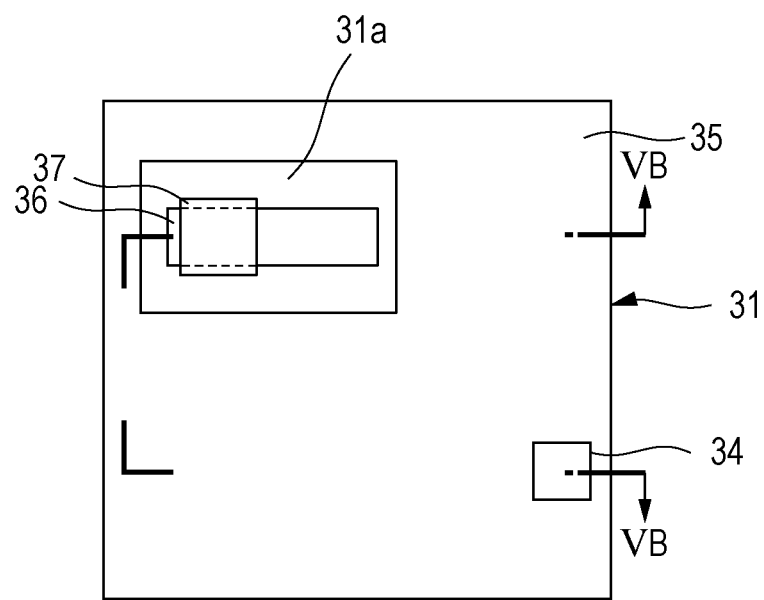
FIG. 5A is a schematic plan view of the unit pixel cell in a process for fabricating the imaging device according to the first exemplary embodiment.
Figure 5B:
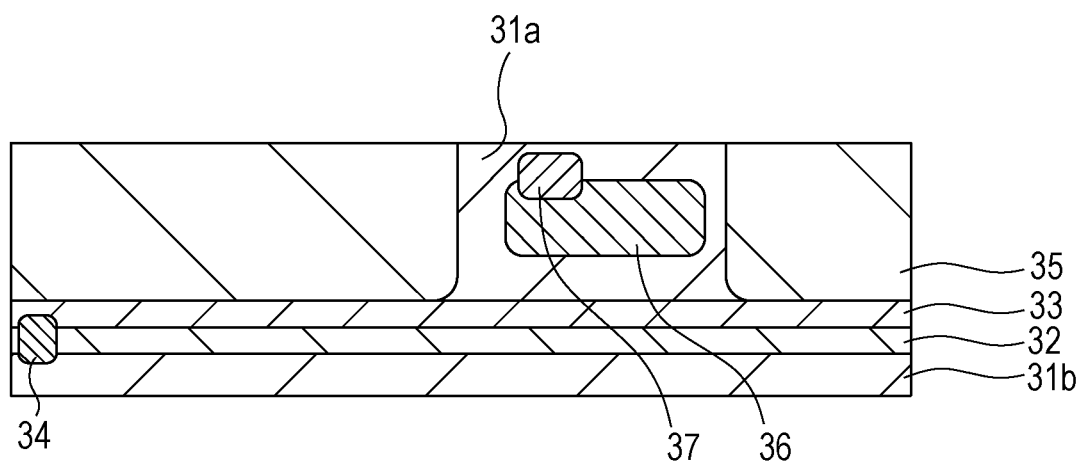
FIG. 5B is a schematic cross-sectional view taken along line VB-VB illustrated in FIG. 5A.
Figure 6A:
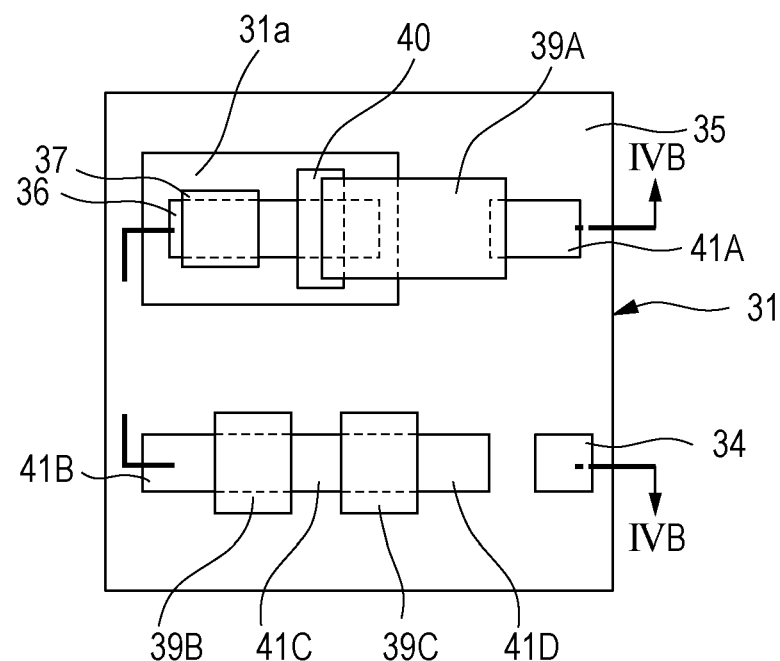
FIG. 6A is a schematic plan view of the unit pixel cell in the process for fabricating the imaging device according to the first exemplary embodiment.
Figure 6B:
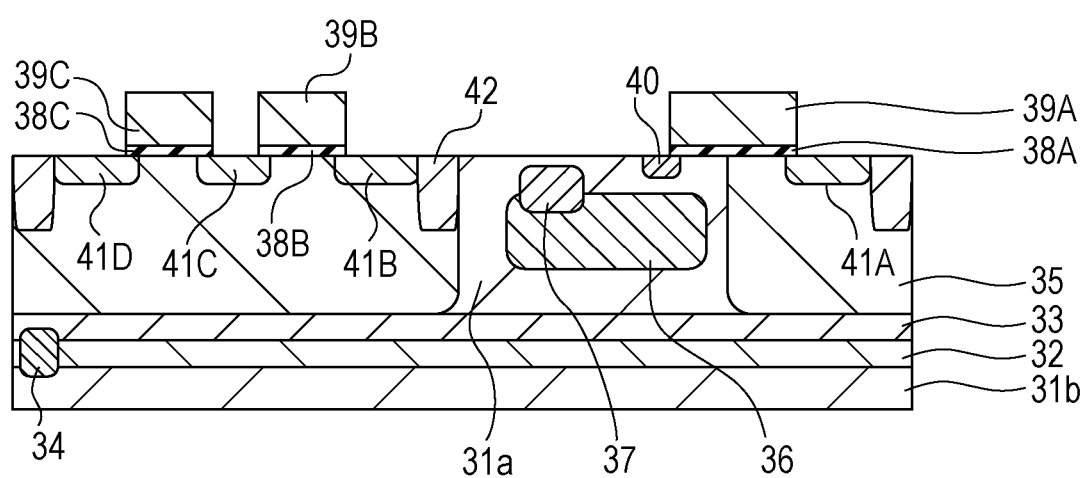
FIG. 6B is a schematic cross-sectional view taken along line VIB-VIB illustrated in FIG. 6A.

FIGS. 5A and 6A are schematic plan views of a unit pixel cell 14. FIG. 5B schematically illustrates a cross section taken along line VB-VB illustrated in FIG. 5A. FIG. 6B schematically illustrates a cross section taken along line VIB-VIB illustrated in FIG. 6A.

First, as illustrated in FIGS. 5A and 5B, resist is applied to the surface of the semiconductor substrate 31, which is composed of p-type silicon. A pixel area (not illustrated) is formed in the semiconductor substrate 31 by a lithography method in which a mask that exposes the pixel area is formed. By implanting n-type impurity ions into the pixel area under a certain implantation condition, the n-type impurity region 32 is formed.

Next, the p-type impurity region 33 is formed by implanting p-type impurity ions. The p-type impurity region 34 is then formed by implanting p-type impurity ions using, as a mask, a resist pattern that exposes part of the pixel area. As a result, part of the n-type impurity region 32 is changed to a p-type region, and the lowest layer region 31b of the semiconductor substrate 31 and the p-type impurity region 33 are connected to each other by the p-type impurity region 34. In this process, the concentration of the p-type impurity ions for forming the p-type impurity region 34 is set higher than that of the n-type impurity ions for forming the n-type impurity region 32.

Next, a resist pattern that exposes a region other than the FD region 24 is formed, and p-type impurity ions are implanted into the exposed region. The p-type impurity region 35 is thus formed. An upper surface of the p-type impurity region 33 and a lower surface of the p-type impurity region 35 come into contact with each other. The potential of the p-type impurity region 35 is the same as a potential given to the lowest layer region 31b of the semiconductor substrate 31.

Next, a resist pattern that exposes part of the pixel area is formed, and n-type impurity ions are implanted into the exposed region. The n-type impurity region 36, which serves as the FD region 24, is thus formed. Next, a resist pattern that exposes part of the pixel area is formed as a mask, and n-type impurity ions are implanted into the exposed region. The n-type impurity region 37 is thus formed. In this process, the range Rp of the n-type impurity region 36 is set shorter than that of the p-type impurity region 33. By separating the n-type impurity region 36 and the p-type impurity region 33 from each other, an electric field of a pn junction formed by the n-type impurity region 36 and the p-type impurity region 33 is reduced. The range Rp of the n-type impurity region 37 is set shorter than that of the n-type impurity region 36.

The n-type impurity region 36, which serves as the FD region 24, is thus separated from the p-type impurity region 33 in the depth direction of the semiconductor substrate 31. The n-type impurity region 36 is separated from the p-type impurity region 35 in the horizontal direction. The electric field of the pn junction around the FD region 24 can therefore be reduced, thereby suppressing leak current.

Next, a resist pattern (not illustrated) that exposes channel regions of the amplifying transistor 11, the reset transistor 12, and the address transistor 13 of the pixel circuit is formed by a lithography method. The channel regions (not illustrated) are then formed by implanting p-type or n-type impurity ions under a certain implantation condition. A desired threshold voltage of each transistor of the pixel circuit can thus be obtained. A channel region refers to a region between a source region and a drain region covered by a gate electrode.

Next, as illustrated in FIG. 6B, the surface of the semiconductor substrate 31 is oxidized through, for example, in-situ steam generation (ISSG). As a result, an insulating film (not illustrated) composed of silicon oxide is formed. A film composed of polysilicon, for example, is then formed on this insulating film through chemical vapor deposition (CVD). Finally, a resist pattern for forming gate electrodes is formed on the film composed of polysilicon by a lithography method.

Next, the insulating film composed of silicon oxide and the film composed of polysilicon are dry-etched using a resist pattern as a mask to form the gate electrodes 39A, 39B, and 39C and the gate insulating films 38A, 38B, and 38C.

Next, a resist pattern that masks the source and drain regions of the amplifying transistor 11, the reset transistor 12, and the address transistor 13 of the pixel circuit is formed by a lithography method, and p-type impurity ions are implanted into a region other than the source and drain regions under a certain implantation condition. The device separation region 42 is thus formed. At this time, the p-type impurity ions are not implanted into regions immediately below the gate electrodes 39A, 39B, and 39C. That is, the device separation region 42 is provided around the source and drain regions and the channel regions.

Next, as illustrated in FIG. 6A, a resist pattern that exposes the region 40 including the end of the gate electrode 39A on the drain side is formed, and p-type impurity ions are implanted using this resist pattern as a mask under a certain implantation condition. The p-type impurity region 40 is thus formed.

As illustrated in FIG. 3B, the range Rp of the p-type impurity region 40 is set shorter than the range Rp of the n-type impurity region 36. Due to diffusion of the implanted p-type impurity ions, the p-type impurity region 40 extends under the gate insulating film 38A. When the p-type impurity ions are implanted, so-called "angle implantation", in which ions are implanted at a certain angle relative to the surface of the semiconductor substrate 31, may be performed. The size of the p-type impurity region formed under the gate insulating film 38A may be controlled through the angle implantation.

Next, a resist pattern that exposes regions in which the source regions and the drain regions of the amplifying transistor 11, the reset transistor 12, and the address transistor 13 of the pixel circuit are to be formed is formed by a lithography method, and n-type impurity ions are implanted through the resist pattern under a certain implantation condition. The n-type impurity regions 41A, 41B, 41C, and 41D are thus formed. At this time, so-called "gate implantation", in which n-type impurity ions are also implanted into the gate electrodes 39A, 39B, and 39C, may be performed.

Next, as illustrated in FIG. 2, an interlayer insulating film formed of silicon oxide, for example, is stacked on the semiconductor substrate 31 through CVD in such a way as to cover the gate electrodes 39A, 39B, and 39C. A resist pattern for forming contact holes is then formed on the interlayer insulating film by a lithography method. Dry etching is performed using the formed resist pattern as a mask. Contact holes connected to the gate electrodes 39A, 39B, and 39C and the n-type impurity regions 41A, 41B, 41D, and 37 are thus formed.

Next, n-type impurity ions are implanted through the formed contact holes. The $n^+$-type impurity region 44 is thus formed on the n-type impurity region 37. Such $n^+$-type impurity regions (not illustrated) are also formed on the gate electrodes 39A, 39B, and 39C and the n-type impurity regions 41A, 41B, and 41D, which are exposed from the contact holes.

Next, the implanted impurity ions are activated through annealing, which reduces the resistance thereof. A polysilicon film including an $n^+$-type impurity is stacked on the interlayer insulating film in order to fill the contact holes. The stacked polysilicon film is then etched back or polished through chemical mechanical polishing (CMP). The contact plugs 45 are thus formed (those on the gate electrodes 39A and 39C and the n-type impurity regions 41A, 41B, and 41D are not illustrated).

Next, the wire 46A, the contact plug 47A, the wire 46B, the contact plug 47B, the wire 46C, and the contact plug 47C are sequentially formed on the semiconductor substrate 31 while stacking the interlayer insulating films 43A, 43B, and 43C. The contact plugs 45 are connected to the wire 46A. The wire 46A is connected to the contact plug 47A. The contact plug 47A is connected to the wire 46B. The wire 46B is connected to the contact plug 47B. The contact plug 47B is connected to the wire 46C. The wire 46C is connected to the contact plug 47C. The contact plug 47C is connected to the pixel electrode 50.

Next, the pixel electrode 50 connected to the contact plug 47C, the photoelectric conversion film 51, the transparent electrode 52, a protection film (not illustrated), a color filter (not illustrated), and a lens (not illustrated) are formed on the interlayer insulating film 43C in this order.

As a result of the above-described process, the imaging device 1 illustrated in FIG. 2 is fabricated. Phosphorus, arsenic, or antinomy, for example, may be used as an n-type impurity. Boron or indium, for example, may be used as a p-type impurity. As a material of the electrodes and the wires of the unit pixel cell 14, one of materials generally used in fabrication of silicon semiconductor devices may be used.

In the present embodiment, the $p^-$-type impurity region 31a is an example of a first conductivity type region. The n-type impurity region 44 is an example of a first impurity region. The n-type impurity region 36 is an example of a second impurity region. The reset transistor 12 is an example of a first transistor.

Second Embodiment

An imaging device 1 according to a second embodiment will be described with reference to FIG. 7. The imaging device 1 according to the present embodiment includes a unit pixel cell 14A illustrated in FIG. 7 instead of the unit pixel cell 14 illustrated in FIG. 2. The unit pixel cell 14A is different from the unit pixel cell 14 illustrated in FIG. 2 in that, in the unit pixel cell 14A, a p-type impurity region 40A is formed in the surface of the semiconductor substrate 31. Differences from the first embodiment will be mainly described hereinafter, and detailed description of common features is omitted.

Figure 7:
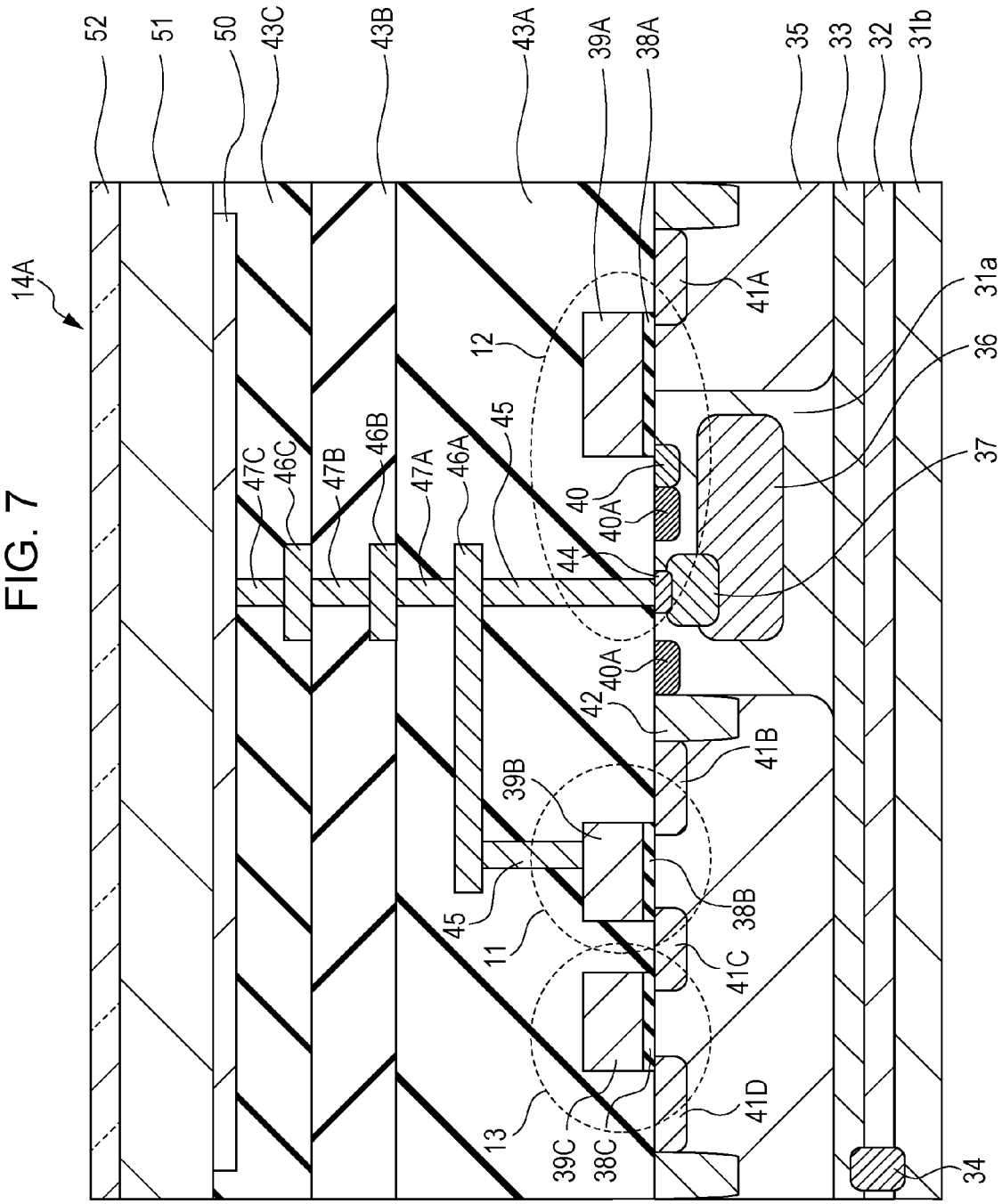
FIG. 7 is a schematic cross-sectional view of a unit pixel cell in an imaging device according to a second exemplary embodiment.

FIG. 7 schematically illustrates a cross section of the unit pixel cell 14A in the imaging device 1 according to the present embodiment.

The p-type impurity region 40A is formed in the surface of the semiconductor substrate 31 around the n-type impurity region 44 in such a way as to be adjacent to the p-type impurity region 40. The impurity concentration of the p-type impurity region 40A is sufficiently high to prevent depletion of the surface of the semiconductor substrate 31 and lower than that of the p-type impurity region 40.

In the present embodiment, the p-type impurity region 40A is formed in the surface of the semiconductor substrate 31 near the FD region 24. Leak current caused by a lattice defect on the surface of the semiconductor substrate 31 can therefore be suppressed more efficiently. In the present embodiment, the p-type impurity region 40A is separated from the n-type impurity region 44, whose impurity concentration is high, under one of the contact plugs 45. An electric field of a pn junction formed between the n-type impurity region 44 and the p-type impurity region 40A can therefore be reduced, thereby suppressing leak current.

A difference between a method for fabricating the imaging device 1 according to the present embodiment and the method for fabricating the imaging device 1 according to the first embodiment is that the p-type impurity region 40A is formed by a lithography method and ion implantation before or after the p-type impurity region 40 is formed. Other steps are the same as those in the method for fabricating the imaging device 1 according to the first embodiment.

Third Embodiment

An imaging device 1 according to a third embodiment will be described with reference to FIG. 8. The imaging device 1 according to the present embodiment includes a unit pixel cell 14B illustrated in FIG. 8 instead of the unit pixel cell 14 illustrated in FIG. 2. The unit pixel cell 14B is different from the unit pixel cell 14 in that, in the unit pixel cell 14B, a burn-in prevention transistor 60 is formed on the semiconductor substrate 31. Differences from the first embodiment will be mainly described hereinafter, and detailed description of common features is omitted.

Figure 8:
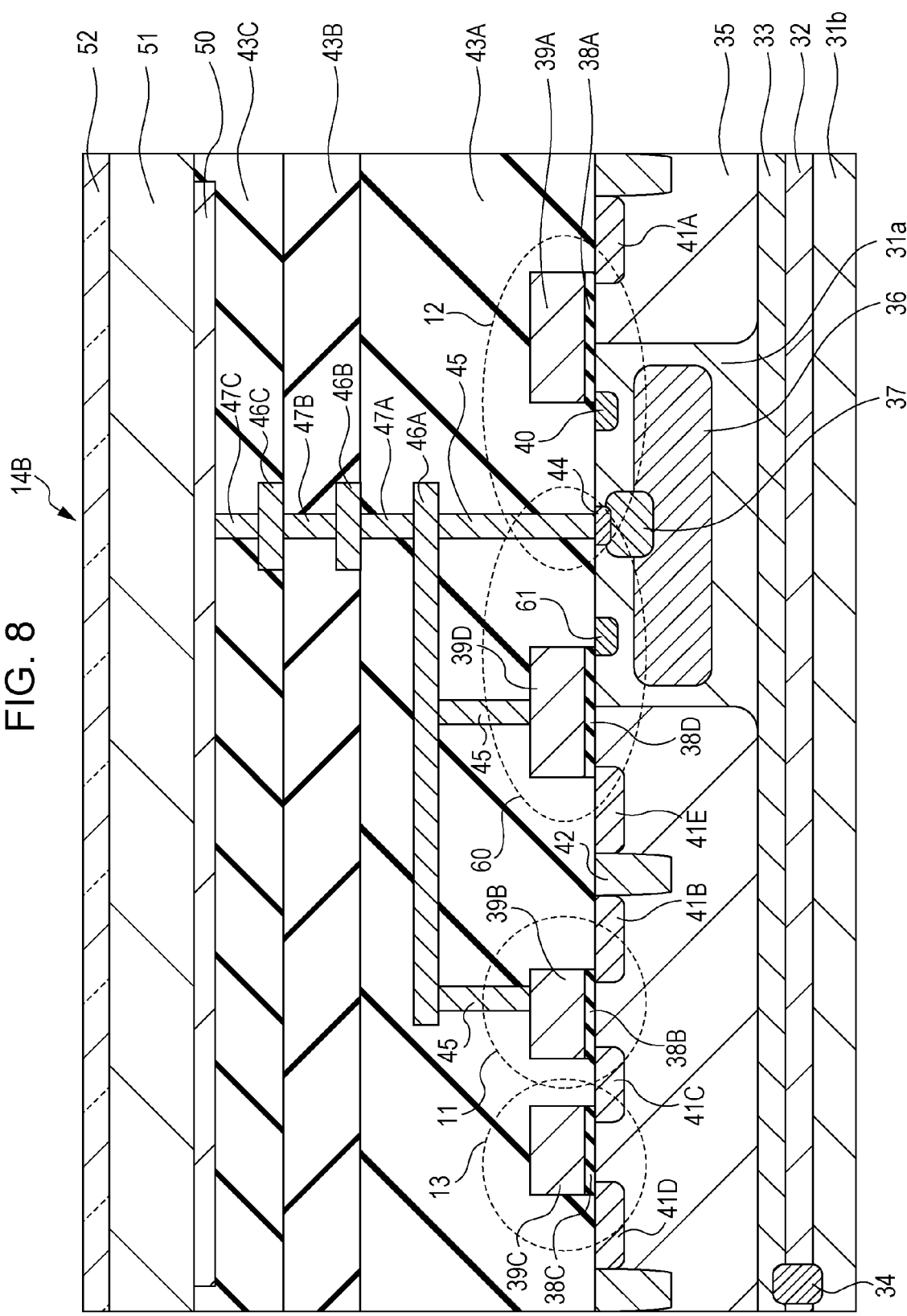
FIG. 8 is a schematic cross-sectional view of a unit pixel cell in an imaging device according to a third exemplary embodiment.

FIG. 8 schematically illustrates a cross section of the unit pixel cell 14B in the imaging device 1 according to the present embodiment.

The burn-in prevention transistor 60 is formed on the semiconductor substrate 31. The burn-in prevention transistor 60 includes a gate electrode 39D, a source region, and a drain region. As illustrated in FIGS. 1 and 8, the FD region 24 functions as the drain region of the burn-in prevention transistor 60. The FD region 24 also functions as the drain region of the reset transistor 12. The n-type impurity regions 36, 37, and 44 are shared by the burn-in prevention transistor 60 and the reset transistor 12 as the drain regions. The gate electrode 39D of the burn-in prevention transistor 60 is formed on the semiconductor substrate 31 through a gate insulating film 38D. An n-type impurity region 41E is formed in the surface of the semiconductor substrate 31. The n-type impurity region 41E functions as the source region of the burn-in prevention transistor 60.

As with the p-type impurity region 40, a p-type impurity region 61 is formed in a region (a region in which the n-type impurity region 36 is formed) on a drain side of the burn-in prevention transistor 60. The p-type impurity region 61 is formed in the surface of the semiconductor substrate 31 partially under the gate electrode 39D. By providing the p-type impurity region 61 under an end portion of the gate electrode 39D on a side of the n-type impurity region 36, leak current caused by a lattice defect on the surface of the semiconductor substrate 31 can be suppressed.

As with the reset transistor 12, the n-type impurity region 36 and the p-type impurity region 35 are separated from each other in the horizontal direction under the gate electrode 39D of the burn-in prevention transistor 60. The electric field of the pn junction between the n-type impurity region 36 and the p-type impurity region 35 can therefore be reduced, thereby suppressing leak current. The ion implantation depth of the n-type impurity region 36 and the ion implantation depth of the p-type impurity region 61 are different from each other. An electric field of a pn junction between the n-type impurity region 36 and the p-type impurity region 61 can therefore be reduced, thereby suppressing leak current. The gate electrode 39D may overlap the n-type impurity region 36 when viewed in the direction perpendicular to the surface of the semiconductor substrate 31.

If an excessive amount of light enters the photoelectric conversion film 51, the potential of the FD region 24 increases up to a bias voltage applied to the transparent electrode 52. If such an excessive voltage is applied to the FD region 24, the FD region 24 or the gate insulating film 38B of the amplifying transistor 11 might be damaged. If the FD region 24 or the gate insulating film 38B is damaged, a failure such as burn-in occurs.

As described above, the drain region and the gate region of the burn-in prevention transistor 60 are connected to the FD region 24. As illustrated in FIG. 1, the source region is connected to a VDD line or a dedicated power supply line 62 for the burn-in prevention transistor 60. It is assumed that light enters the photoelectric conversion film 51 and the potential of the FD region 24 exceeds VDD. In this case, an excessive charge can be transmitted to the power supply line 62 by setting an appropriate threshold in order to turn on the burn-in prevention transistor 60. A failure such as burn-in can thus be prevented.

According to the present embodiment, dark current can be suppressed, and, even if an excessive amount of light enters, the transistors are not damaged.

Fourth Embodiment

An imaging device 1 according to a fourth embodiment will be described with reference to FIG. 9. The imaging device 1 according to the present embodiment includes a unit pixel cell 14C illustrated in FIG. 9 instead of the unit pixel cell 14 illustrated in FIG. 2. The unit pixel cell 14C is different from the unit pixel cell 14 in that, in the unit pixel cell 14C, the configuration of the reset transistor 12 on the drain side is also applied to the source side. Differences from the first embodiment will be mainly described hereinafter, and detailed description of common features is omitted.

Figure 9:
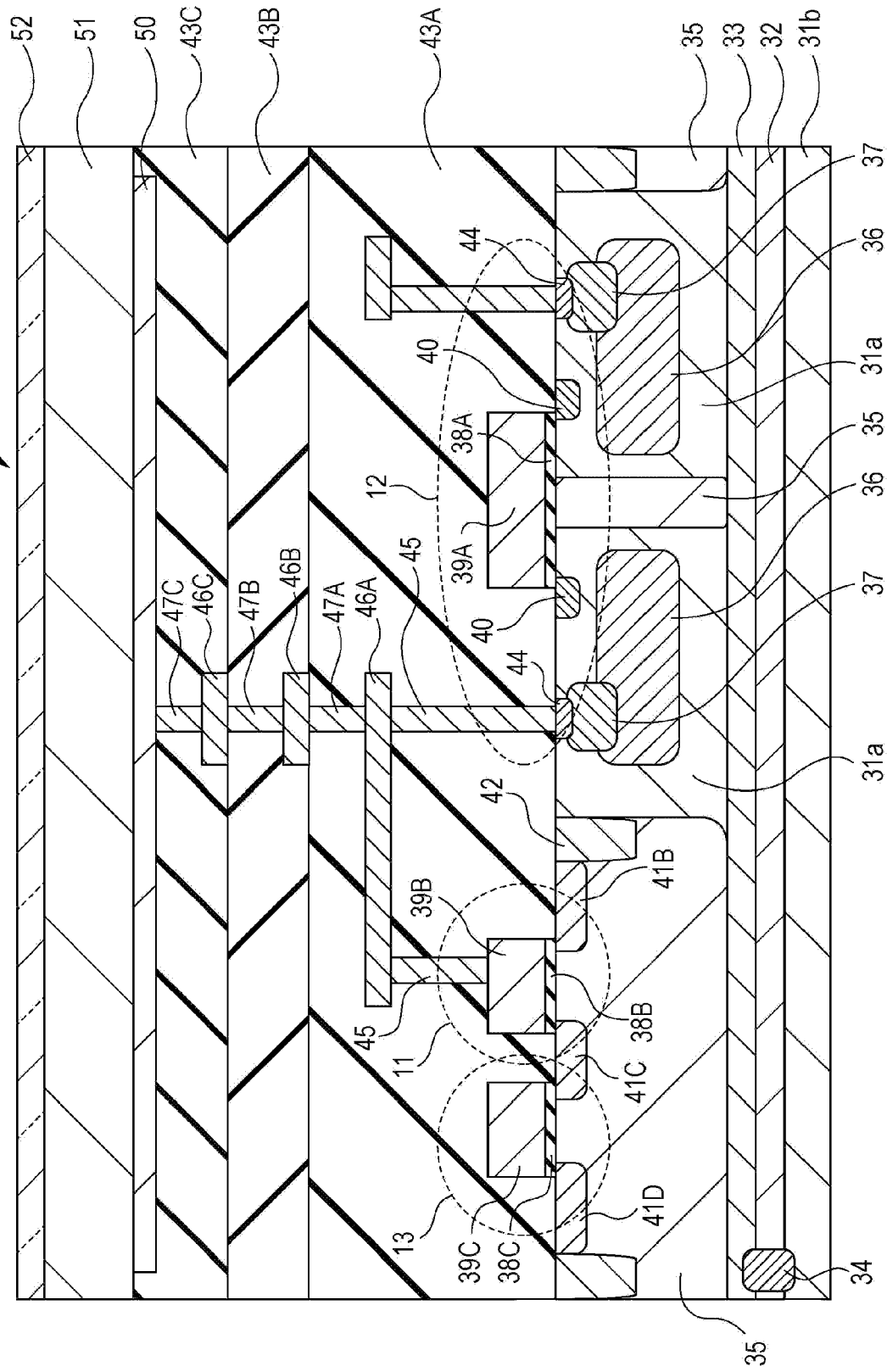
FIG. 9 is a schematic cross-sectional view of a unit pixel cell in an imaging device according to a fourth exemplary embodiment.

FIG. 9 schematically illustrates a cross section of the unit pixel cell 14C in the imaging device 1 according to the present embodiment.

The p⁻-type impurity region 31a, the p-type impurity region 40, and the n-type impurity regions 36, 37, and 44 are formed in a region on the source side of the reset transistor 12 instead of the p-type impurity region 35 and the n-type impurity region 41A. The impurity concentration profile in the impurity regions on the source side may be the same as that in the impurity regions on the drain side.

According to the present embodiment, the effect produced in the region on drain side can also be produced in the region on the source side. In addition, a configuration for suppressing leak current can be applied to the region on the source side without increasing fabrication steps. The unit pixel cell 14C according to the present embodiment can therefore be driven using various methods and used in various circuit configurations.

Fifth Embodiment

An imaging device 1 according to a fifth embodiment will be described with reference to FIGS. 10 and 11. A unit pixel cell 14D in the imaging device 1 according to the present embodiment is different from the unit pixel cell 14 in that the unit pixel cell 14D includes a transistor (hereinafter referred to as a "transfer transistor 70") connected in series with the reset transistor 12. Differences from the first embodiment will be mainly described hereinafter, and detailed description of common feature is omitted.

Figure 10:
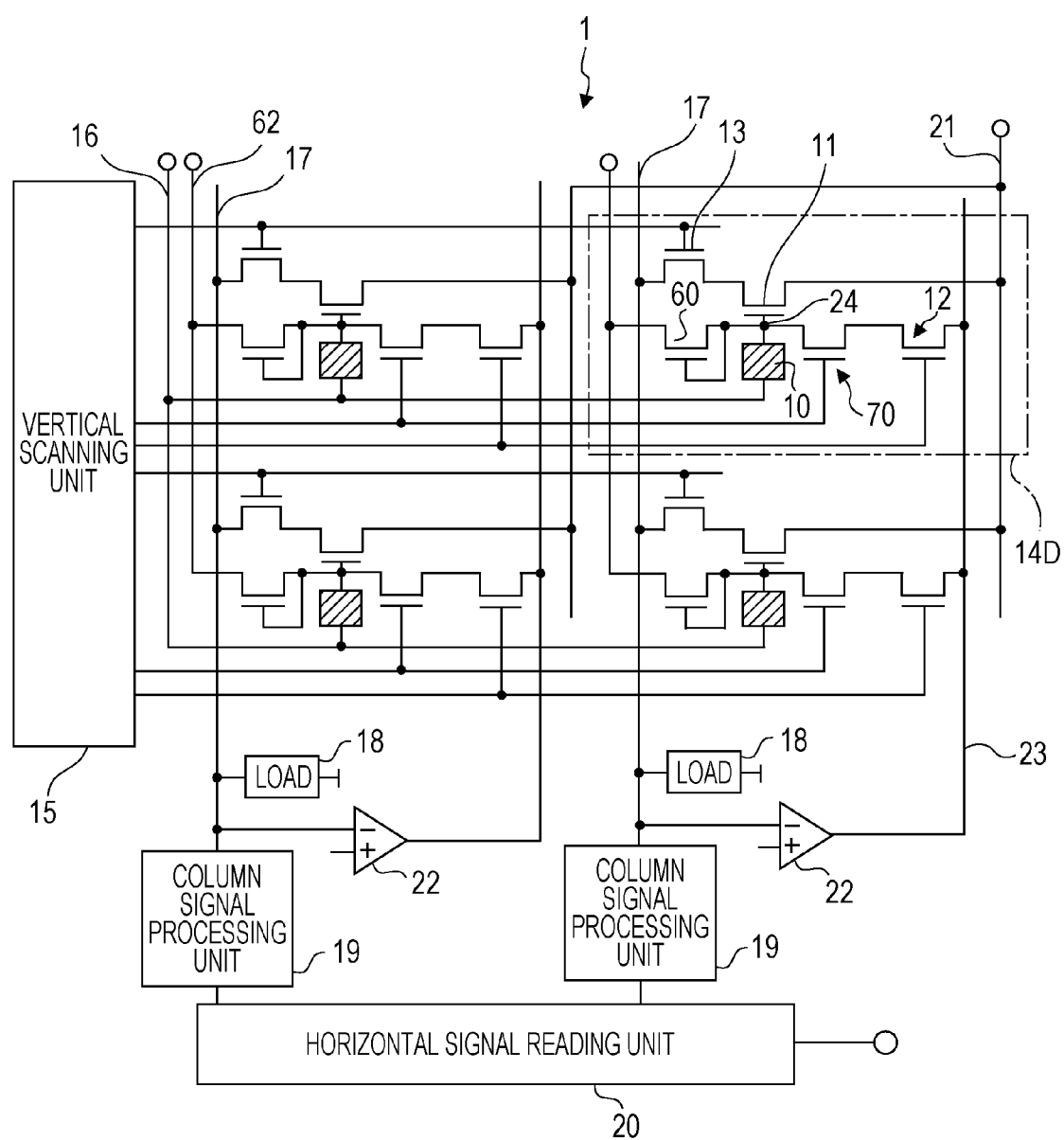
FIG. 10 is a schematic diagram illustrating the circuit configuration of an imaging device according to a fifth exemplary embodiment.

FIG. 10 schematically illustrates the circuit configuration of the imaging device 1 according to the fifth embodiment. In each unit pixel cell 14D, the transfer transistor 70 is provided between the FD region 24 and the reset transistor 12. A drain of the transfer transistor 70 is electrically connected to the gate of the amplifying transistor 11. A source of the transfer transistor 70 is electrically connected to the drain of the reset transistor 12. A reset circuit can thus be realized by the reset transistor 12 and the transfer transistor 70. The vertical scanning unit 15 controls the gate voltage of the transfer transistor 70 through a corresponding control line.

Figure 11:
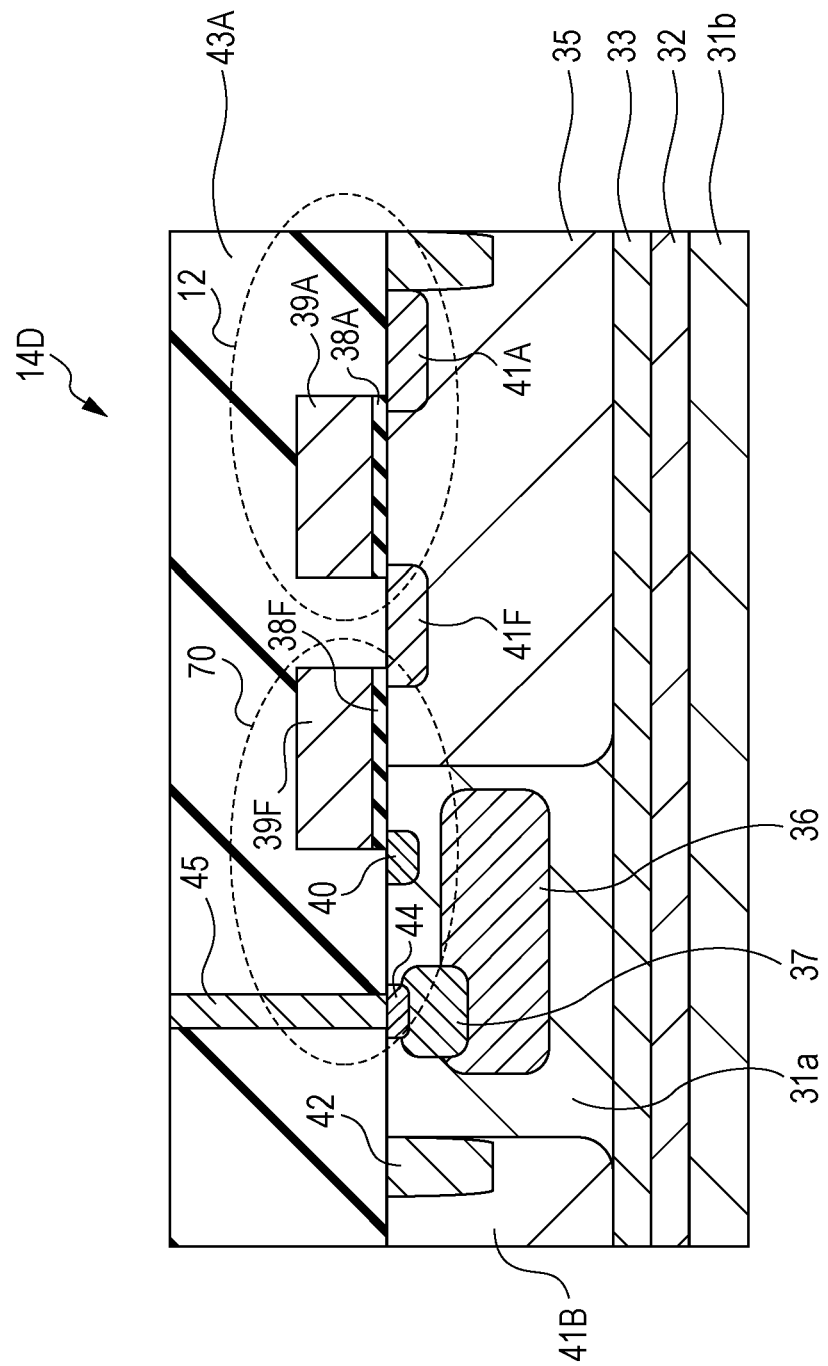
FIG. 11 is a schematic cross-sectional view of a portion of a unit pixel cell in the imaging device according to the fifth exemplary embodiment around a transfer transistor.

FIG. 11 schematically illustrates a cross section of a portion of the unit pixel cell 14D around the transfer transistor 70. The n-type impurity regions 36, 37, and 44 function as a drain region of the transfer transistor 70. Positions of the impurity regions in the p⁻-type impurity region 31a on a drain side of the transfer transistor 70 and a relationship between impurity concentrations are as described in the first embodiment.

According to the present embodiment, the reset operation and the operation for accumulating signal charge can be separated from each other by the transfer transistor 70, thereby stabilizing and shortening the reset operation.

Other Embodiments

An example of the layout of the gate electrode 39A of the reset transistor 12 different from that illustrated in FIG. 4 will be described with reference to FIGS. 12A to 12E.

FIG. 12A is a plan view of a portion of the unit pixel cell 14 around the FD region 24 and the gate electrode 39A viewed in the direction perpendicular to the surface of the semiconductor substrate 31. The FD region 24 illustrated in FIGS. 12A to 12E is mainly the n-type impurity region 36. The p-type impurity region 40 is not illustrated for the sake of simplicity. In this example of layout, when viewed in the direction perpendicular to the surface of the semiconductor substrate 31, a width W1 of the gate electrode 39A is larger than a width W2 of the FD region 24 in a direction (x direction in FIG. 12A) that defines the width of the gate of the reset transistor 12. As illustrated in FIG. 12A, the gate electrode 39A may be arranged in such a way as to overlap the p-type impurity region 35. As a result, the width W1 of the gate electrode 39A becomes sufficiently larger than the width W2 of the FD region 24. As described above, ends of the FD region 24 are separated from the p-type impurity region 35 in the horizontal direction.

In the example of the related art, because the FD region 24 is depleted, a so-called "narrow channel effect" undesirably occurs in the reset transistor 12, making it difficult to operate the reset transistor 12 normally. In addition, because of parasitic capacitance between the FD region 24 and the p-type impurity region 35, the accuracy of the feedback operation undesirably decreases.

According to this example of layout, the following specific effects can be produced:

(1) The depletion of the FD region 24 can be suppressed, and the narrow channel effect can be significantly suppressed;

(2) The parasitic capacitance of the FD region 24 can be reduced, and a decrease in the driving force of the reset transistor 12 can be suppressed;

(3) A depletion layer around the FD region 24 expands to a region (that is, the p$^-$-type impurity region 31a) between the FD region 24 and the p-type impurity region 35, and an electric field of a pn junction between the FD region 24 and the p-type impurity region 35 can be reduced, thereby suppressing leak current; and (4) The parasitic capacitance around the FD region 24 can be reduced and coupling capacitance between the gate electrode 39A of the reset transistor 12 and the FD region 24 can be increased, thereby improving the accuracy of the feedback operation.

FIGS. 12B to 12E illustrate variations of the layout of the gate electrode 39A. FIGS. 12B to 12E also illustrate the n-type impurity region 41A on the source side of the reset transistor 12. Insofar as the width W1 of the gate electrode 39A on the side of the FD region 24 is sufficiently larger than the width W2 of the FD region 24, the gate electrode 39A may take various shapes. The gate electrode 39A may, for example, be notched.

A region arranged on the source side of the reset transistor 12 need not be the n-type impurity region 41A. As illustrated in FIG. 9, the FD region 24 may be arranged. In this case, concentration, width, and/or length (length in a y direction illustrated in FIG. 12A) may be different between the FD regions 24 arranged on the drain side and the source side of the reset transistor 12. Distances between ends of the FD regions 24 in p$^-$-type impurity regions 31a and the p-type impurity region 35 may be different from each other.

The imaging device and the method for fabricating an imaging device in the present disclosure are effective in an image sensor used for an image capture apparatus typified by a digital camera and fabrication of the image sensor.

The present disclosure further includes the following imaging device and method for fabricating an imaging device.

(1) a width of a gate electrode of the reset transistor may be larger than a width of the second impurity region in a direction that defines a gate width of the reset transistor in the plan view.

In this configuration, the narrow channel effect can be significantly suppressed. In addition, a decrease in the driving force of the reset transistor can be suppressed.

(2) the gate electrode of the reset transistor may be formed in such a way as to overlap the pixel well region of a first conductivity type in the plan view.

In this configuration, a variation of the gate electrode of the reset transistor can be provided.

(3) the gate electrode of a reset transistor may be notched in the plan view.

In this configuration, a variation of the gate electrode can be provided.

(4) A method for fabricating an imaging device may include:

implanting an impurity of a second conductivity type into a semiconductor substrate of a first conductivity type and forming a second impurity region of the second conductivity type;

forming a gate electrode of a reset transistor on the semiconductor substrate;

forming, after the gate electrode is formed, a third impurity region of the first conductivity type on a surface of the semiconductor substrate in such a way as to overlap a region in which the gate electrode of a reset transistor and the second impurity region overlap; and forming a first impurity region of the second conductivity type on the surface of the semiconductor substrate in such a way as not to overlap the third impurity region in the plan view.

According to the method, an effect of dark current can be suppressed, and an imaging device capable of capturing a high-resolution image can be provided.

(5) The method further includes implanting, before the gate electrode is formed, an impurity of the second conductivity type and forming a fourth impurity region of the second conductivity type that electrically connects the first impurity region and the second impurity region to each other.

In this configuration, the second impurity region can be formed at a deeper position in the semiconductor substrate. An imaging device can therefore be provided in which an electric field of a pn junction is reduced and leak current is suppressed.

What is claimed is:

1. An imaging device comprising:
unit pixel cells arranged one-dimensionally or two-dimensionally, each of the unit pixel cells comprising:
a semiconductor substrate including a first conductivity type region of a first conductivity type, a first impurity region of a second conductivity type provided in the first conductivity type region, and a second impurity region of the second conductivity type provided in the first conductivity type region;
a photoelectric converter located above the semiconductor substrate; and
a first transistor including a first gate electrode and at least a part of the second impurity region as any one of a source and a drain of the first transistor, wherein
the first impurity region is at least partially located in a surface of the semiconductor substrate, the first impurity region being electrically connected to the photoelectric converter, the second impurity region is electrically connected to the photoelectric converter via the first impurity region, the second impurity region having an impurity concentration lower than an impurity concentration of the first impurity region, and a first portion of the second impurity region overlaps a second portion of the first gate electrode in a plan view.

2. The imaging device according to claim 1, wherein the first portion and the second portion are separated from each other via the first conductivity type region.

3. The imaging device according to claim 1, wherein a reset voltage for initializing the photoelectric converter is applied to the photoelectric converter through the first transistor.

4. The imaging device according to claim 1, wherein the first transistor is a reset transistor.

5. The imaging device according to claim 1, wherein
the semiconductor substrate further includes a third impurity region of the first conductivity type provided in the first conductivity type region, the third impurity region being partially located in the surface of the semiconductor substrate,
a third portion of the third impurity region overlaps an end portion of the first gate electrode in the plan view, the end portion being on a side closer to the second impurity region, and
in a profile of impurity concentrations in a depth direction from the surface of the semiconductor substrate, a second depth is larger than a third depth, the impurity concentration of the second impurity region being highest at the second depth, an impurity concentration of the third impurity region being highest at the third depth.

6. The imaging device according to claim 5, wherein, in the profile, the second depth is larger than a first depth, the impurity concentration of the first impurity region being highest at the first depth.

7. The imaging device according to claim 5, wherein the semiconductor substrate further includes a fourth impurity region of the second conductivity type provided in the first conductivity type region, the fourth impurity region electrically connecting the first impurity region and the second impurity region.

8. The imaging device according to claim 7, wherein,
in the profile, a maximum value of the impurity concentration of the first impurity region is larger than a maximum value of the impurity concentration of the second impurity region, and
the maximum value of the impurity concentration of the first impurity region is larger than a maximum value of a impurity concentration of the fourth impurity region.

9. The imaging device according to claim 5, wherein the third portion of the third impurity region overlaps at least a part of the second portion of the first gate electrode in the plan view.

10. The imaging device according to claim 1, wherein the semiconductor substrate further includes a separation region of the first conductivity type, the separation region not overlapping the second impurity region in the plan view.

11. The imaging device according to claim 1, wherein the semiconductor substrate further includes a pixel well region of the first conductivity type, the pixel well region not overlapping the second impurity region in the plan view.

12. The imaging device according to claim 11, wherein the semiconductor substrate further includes:
a fifth impurity region of the first conductivity type located under the first conductivity type region and the pixel well region, the fifth impurity region being in contact with the first conductivity type region and the pixel well region;
a sixth impurity region of the second conductivity type located under the fifth impurity region, the sixth impurity region being in contact with the fifth impurity region;
a seventh impurity region of the first conductivity type located under the sixth impurity region, the seventh impurity region being in contact with the sixth impurity region; and
an eighth impurity region of the first conductivity type located between the fifth impurity region and the seventh impurity region, the eighth impurity region electrically connecting the fifth impurity region and the seventh impurity region.

13. The imaging device according to claim 5, wherein the third impurity region, the second impurity region, and the first conductivity type region adjoin in this order to form two p-n junctions in the surface of the semiconductor substrate under the first gate electrode.

14. The imaging device according to claim 1, wherein
each of the unit pixel cells further includes a second transistor including a second gate electrode and at least a part of the second impurity region as any one of a source and a drain of the second transistor,
the second gate electrode is electrically connected to the first impurity region, and
a forth portion of the second impurity region overlaps a fifth portion of the second gate electrode in the plan view.

15. The imaging device according to claim 14, wherein the second transistor turns on when a predetermined amount or more of light enters the photoelectric converter.

16. The imaging device according to claim 5, wherein
the semiconductor substrate further includes a ninth impurity region of the first conductivity type provided in the first conductivity type region, the ninth impurity region being in contact with the third impurity region in the surface of the semiconductor substrate and being located between the first impurity region and the third impurity region, and
an impurity concentration of the ninth impurity region is lower than the impurity concentration of the third impurity region.

17. The imaging device according to claim 1, wherein the first impurity region overlaps the second impurity region in the plan view.

18. An imaging device comprising:
unit pixel cells arranged one-dimensionally or two-dimensionally, each of the unit pixel cells comprising:
a semiconductor substrate of a first conductivity type;
a photoelectric converter located above the semiconductor substrate, the photoelectric converter converting incident light into signal charge;
a reset transistor provided to the semiconductor substrate;
a first impurity region of a second conductivity type located in a surface of the semiconductor substrate, the first impurity region being electrically connected to the photoelectric converter; and
a second impurity region of the second conductivity type located in the semiconductor substrate, the second impurity region being electrically connected to the first impurity region and accumulating the signal charge, wherein the second impurity region has an impurity concentration lower than an impurity concentration of the first impurity region, and at least a part of the second impurity region overlaps a gate electrode of the reset transistor in a plan view.

19. The imaging device according to claim 18, wherein the first impurity region overlaps the second impurity region in the plan view.

20. An imaging device comprising:
unit pixel cells arranged one-dimensionally or two-dimensionally, each of the unit pixel cells including:
a semiconductor substrate of a first conductivity type;
a photoelectric converter located above the semiconductor substrate, the photoelectric converter converting incident light into signal charge;
a reset transistor provided to the semiconductor substrate;
a first impurity region of a second conductivity type located in a surface of the semiconductor substrate, the first impurity region being electrically connected to the photoelectric converter;
a second impurity region of the second conductivity type, located in the semiconductor substrate, the second impurity region being any one of a source and a drain of the reset transistor; and
a third impurity region of the first conductivity type formed in the surface of the semiconductor substrate, wherein the first impurity region and the second impurity region are electrically connected to each other, at least a part of the third impurity region overlaps an end portion of a gate electrode of the reset transistor in a plan view, the second impurity region is located below the first impurity region and the third impurity region and at least a part of the second impurity region overlaps the gate electrode of the reset transistor in the plan view.

* * * * *